United States Patent
Pan et al.

(10) Patent No.: US 11,031,846 B2
(45) Date of Patent: Jun. 8, 2021

(54) CO-PACKAGED ELECTRIC MOTOR AND MOTOR DRIVE

(71) Applicant: ABB Schweiz AG, Baden (CH)

(72) Inventors: Zach Pan, Cary, NC (US); Liming Liu, Cary, NC (US); Colin Tschida, Durham, NC (US)

(73) Assignee: ABB Schweiz AG, Baden (CH)

( * ) Notice: Subject to any disclaimer, the term of this patent is extended or adjusted under 35 U.S.C. 154(b) by 313 days.

(21) Appl. No.: 16/297,039

(22) Filed: Mar. 8, 2019

(65) Prior Publication Data

US 2020/0287444 A1 Sep. 10, 2020

(51) Int. Cl.
| | |
|---|---|
| H02K 9/22 | (2006.01) |
| H02K 11/33 | (2016.01) |
| H01L 23/38 | (2006.01) |
| H02K 5/04 | (2006.01) |
| H01L 35/30 | (2006.01) |

(52) U.S. Cl.
CPC ............... *H02K 9/22* (2013.01); *H01L 23/38* (2013.01); *H02K 5/04* (2013.01); *H02K 11/33* (2016.01); *H01L 35/30* (2013.01)

(58) Field of Classification Search
CPC ............. H02K 9/22; H02K 5/04; H02K 11/33
See application file for complete search history.

(56) References Cited

U.S. PATENT DOCUMENTS

| | | | |
|---|---|---|---|
| 6,005,310 A * | 12/1999 | Mosciatti | H02K 9/20 |
| | | | 310/12.02 |
| 6,298,183 B1 | 10/2001 | Yamauchi et al. | |
| 6,300,706 B1 * | 10/2001 | Grudkowski | H01L 27/20 |
| | | | 257/E27.006 |
| 6,568,193 B1 | 5/2003 | Cahill | |
| 9,572,552 B1 | 2/2017 | Bodor et al. | |
| 2009/0020081 A1 | 1/2009 | Claypole et al. | |
| 2013/0049495 A1 | 2/2013 | Matsuo | |
| 2014/0232217 A1 | 8/2014 | Miyama | |
| 2016/0233737 A1 | 8/2016 | Nakamura et al. | |
| 2017/0294821 A1 | 10/2017 | Shimizu et al. | |

FOREIGN PATENT DOCUMENTS

| | | |
|---|---|---|
| CN | 107171499 A | 9/2017 |
| EP | 3331135 A1 | 6/2018 |
| WO | 2015093138 A1 | 6/2015 |

OTHER PUBLICATIONS

Wrzecionko et al.; A 120° C. Ambient Temperature Forced Air-Cooled Normally-off Sic JFET Automotive Inverter System; IEEE Transactions on Power Electronics, vol. 29, No. 5, May 2014; 14 pgs.

(Continued)

*Primary Examiner* — Dang D Le

(74) *Attorney, Agent, or Firm* — Taft Stettinius & Hollister LLP

(57) ABSTRACT

A combined electric motor and motor drive are provided. The electric motor and motor drive are attached together to form a co-packaged unit. In the co-packaged electric motor and motor drive, both the motor drive and the electric motor generate heat. A thermoelectric cooler is provided that may transfer heat away from the motor drive. The thermoelectric cooler may also insulate the motor drive from the heat generated by the motor.

20 Claims, 3 Drawing Sheets

(56) References Cited

OTHER PUBLICATIONS

Olesen et al.; "ShowerPower" New Cooling Concept for Automotive Applications; Automotive Power Electronics—Jun. 21-22, 2006; 10 pgs.
Senyildiz et al.; Thermal Management Concepts for Power Electronic Modules; Danfoss Silicon Sower GmbH, Department of Research and Development, Heinrich-Hertz-Strasse 2, 24837 Schleswig, Germany; 6 pgs.
Liang et al.; Advanced Packaging of SiC Power Module for Automotive Applications; Power Electronics and Electric Machinery Group Oak Ridge National Laboratory Knoxville, TN, USA; 2003 IEEE; 8 pgs.
Wang et al.; Active Cooling Substrates for Thermal Management of Microelectronics; IEEE Transactions on Components and Packaging Technologies, vol. 28, No. 3, Sep. 2005; 7 pgs.
Power Electronics Newsletter; First Quarter 2006; vol. 18, No. 1; ISSN 1054-7231; Electronics Technologies for Extreme Environment Electronics; 24 pgs.
Wheeler et al.; A Fully Integrated 30kW Motor Drive Using Matrix Converter Technology; University of Nottingham School of Electrical and Electronic Engineering Nottingham, NG7 2RD, UK; 6pgs.
Tenconi et al.; Temperatures Evaluation in an Integrated Motor Drive for Traction Applications; IEEE Transactions on Industrial Electronics, vol. 55, No. 10, Oct. 2008; 8 pgs.
Bauer et al.; Thermal design of integrated motor drives for traction applications; Institute for Power Electronics and Electrical Drives, Aachen University Jaegerstrasse 17-19 Aachen, Germany; 10 pgs.
Haque et al.; Thermal Manaement of High-Power Electronics Modules Packaged With Interconnected Parallel Plates; Virginia Power Electronics Center Virginia Polytechnic Institute and State University Blacksburg, VA 24061; 9 pgs.
Peltier Application Note; 20050 SW 112th Ave. Tualatin, Oregon 97062; 9 pgs.
GAN Systems; Top-side cooled 650 V E-mode GaN transistor; Preliminary Datasheet; 2009-2017 GaN Systems Inc.; 13 pgs.
High Performance and Highly Reliable Solution for Cooling and Heating Applications; Thermonamic Module; Specification of Thermoelectric Module; TEC1-12710; 3 pgs.
Patent Cooperation Treaty, International Search Report and Written Opinion issued in corresponding International application No. PCT/US2020/021316, dated May 19, 2020, 8 pp.

\* cited by examiner

CO-PACKAGED ELECTRIC MOTOR AND MOTOR DRIVE

BACKGROUND

The present inventions relate generally to electric motors, and more particularly, to an electric motor with a motor drive provided thereon.

In an electric motor, a rotor is forced to rotate by a rotating magnetic field generated by a stator. Although it is possible for the rotating magnetic field to be generated directly from electric power supplied by the electric grid or other power source, many modern electric motors use a motor drive that converts the supplied electric power to a more suitable power delivered to the motor. Typically, electric motor drives include semiconductor switches that are turned on and off at high frequencies to convert the power supply. Because the semiconductors transmit full power therethrough to power the electric motor, they can generate significant heat. The motor also generates significant heat during operation. Usually, the heat generated by the motor is greater than the heat generated by the motor drive. Since heat is detrimental to the performance and longevity of the semiconductor switches, it is common to separate the motor drive from the electric motor. That is, the motor drive may be located some distance from the electric motor, and the drive and motor may be interconnected with cables to transmit electric power from the drive to the motor. This allows the motor drive to be located in a cooler place away from the heat generated by the electric motor. Even so, it is still common even when the drive is positioned away from the motor to provide additional cooling for the drive, such as active cooling like liquid refrigeration systems, or passive cooling like heatsinks.

It is believed that it would be desirable to provide an electric motor where the motor drive is located on the motor and not located away from the motor. This would provide a more compact and flexible design. However, there are concerns with the combination of heat that will be generated from the motor drive and the motor and how this will affect the performance of the semiconductor switches in the drive. Thus, a solution for a co-packaged electric motor and motor drive would be desirable.

SUMMARY

An electric motor and motor drive are described. The motor drive is mounted on the motor so that the electric motor and motor drive form a single packaged unit. The motor drive includes solid-state switches to convert power supplied to the motor. In order to control the temperature of the solid-state switches, a thermoelectric cooler is provided to draw heat away from the solid-state switches.

BRIEF DESCRIPTION OF SEVERAL VIEWS OF THE DRAWINGS

The invention may be more fully understood by reading the following description in conjunction with the drawings, in which.

DETAILED DESCRIPTION

Figure 1:
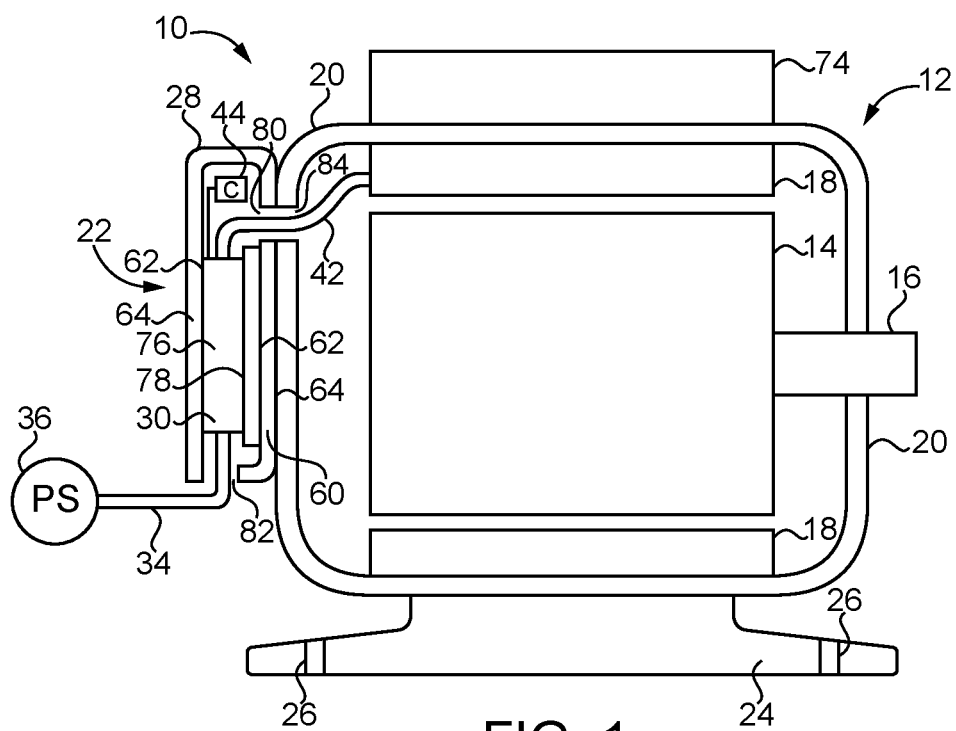
FIG. 1 is a cross-sectional view of a co-packaged electric motor and motor drive.

Referring now to the figures, and particularly FIG. 1, a co-packaged electric motor and motor drive 10 is shown. The motor 12 includes a rotor 14 connected to an output shaft 16 and a stator 18. As is well-known, the stator 18 generates a rotating magnetic field that interacts with the rotor 14 to cause the rotor 14 and output shaft 16 to rotate. The motor 12 also includes a housing 20 that encloses the stator 18 and rotor 14.

A motor drive 22 is also provided which is mounted on the motor 12. Unlike some conventional arrangements, where the motor drive 22 and the motor 12 are separate from each other and may be separately located as desired, the motor drive 22 and motor 12 may be considered a single unit that is mounted in place using the mounting structure of the motor 12, such as a mounting base 24 with connection holes 26.

The motor drive 22 is enclosed within another housing 28. It is understood that, while FIG. 1 illustrates two housings 20, 28 for the motor 12 and the drive 22, the two housings 20, 28 may also be incorporated as a combined housing. Whether the two housings 20, 28 are two separate housings 20, 28 or one integral housing, the two housings 20, 28 are attached together so that the housings 20, 28, motor 12 and drive 22 form a co-packaged unit 10.

Figure 2:
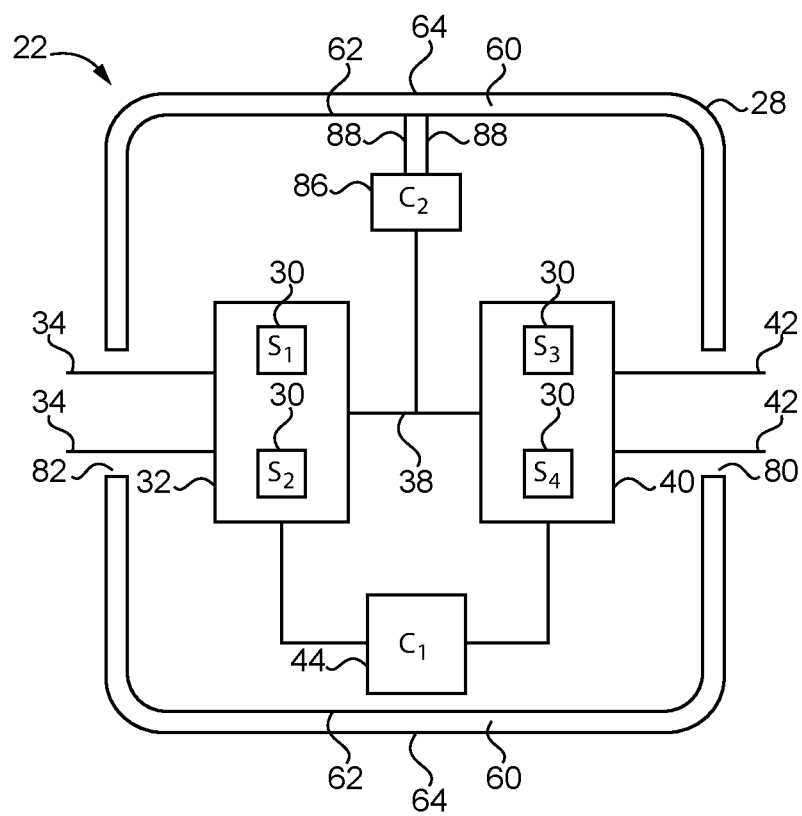
FIG. 2 is a schematic view of the motor drive.

A schematic of the motor drive 22 is shown in FIG. 2. As shown, the drive 22 has a plurality of solid-state switches 30 (e.g., semiconductor switches 30). A common example of the type of switches 30 that may be used in the motor drive 22 are Insulated-Gate Bipolar Transistors (IGBT). There are many types of switch arrangements that are known and that may be used, and therefore, a detailed explanation of the switches 30 and switching arrangement is not needed. A common type of drive 22, however, includes one set of switches 32 that rectifies AC power 34 from an input power supply 36 to DC power 38. The DC power 38 is then supplied to a second set of switches 40 that inverts the DC power 38 back into AC power 42 that is supplied to the stator 18. The motor drive 22 also includes a controller 44 that controls the on/off switching sequence of the switches 30. As a result, the frequency or other electrical properties of the electrical input power 34 may be converted to an electrical output power 42 supplied to the stator 18 that has a frequency or electrical property that is suitable for the motor 12. Thus, as shown in FIG. 1, conducting cables 34 (i.e., a set of conductors 34) are connected to the motor drive 22 from the power supply 36, such as the AC power grid 36, to supply electrical input power to the motor drive 22. After being converted by the motor drive 22, the electrical output power is supplied to the stator 18 through conducting cables 42 (i.e., a set of conductors 42) connecting the drive 22 to the stator 18.

Figures 4A, 4B:
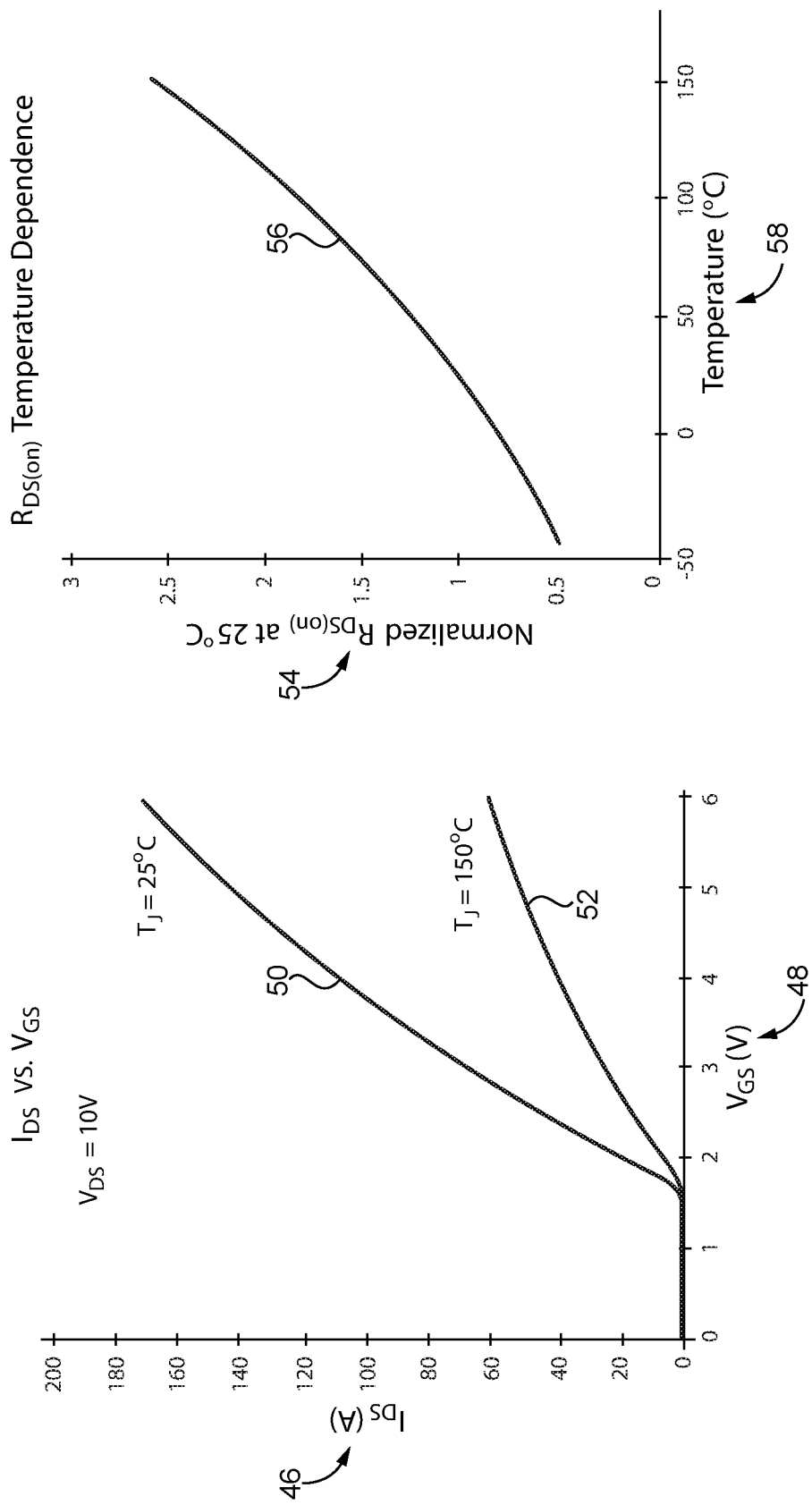
FIG. 4A is a chart of the performance of a gallium nitride switch, showing gate voltage versus current through the switch.
FIG. 4B is a chart showing the resistance increase of a gallium nitride switch as the temperature of the switch rises.

One problem in a co-packaged electric motor and motor drive 10 is the combined generation of heat from the motor drive 22 and the motor 12. This can also be a particular concern for high performance solid-state switches 30 like gallium nitride and silicon carbide switches 30. For example, as shown in FIG. 4A, the output current 46 of a gallium nitride switch 30 is significantly greater for a respective applied gate voltage 48 at a temperature of 25° C.

(50) than at a temperature of 150° C. (52). FIG. 4B shows how the resistance 54 of a gallium nitride switch 30 increases 56 as the temperature 58 of the switch 30 increases. Thus, significantly greater performance may be achieved from the switches 30 if the temperature of the switches 30 can be maintained at a lower level. It is also likely the case that other components in the motor drive housing 28, such as the controllers 44, 86 or other active or passive electrical components, will also have better performance and/or longevity with a lower temperature in the housing 28.

Figure 3B:
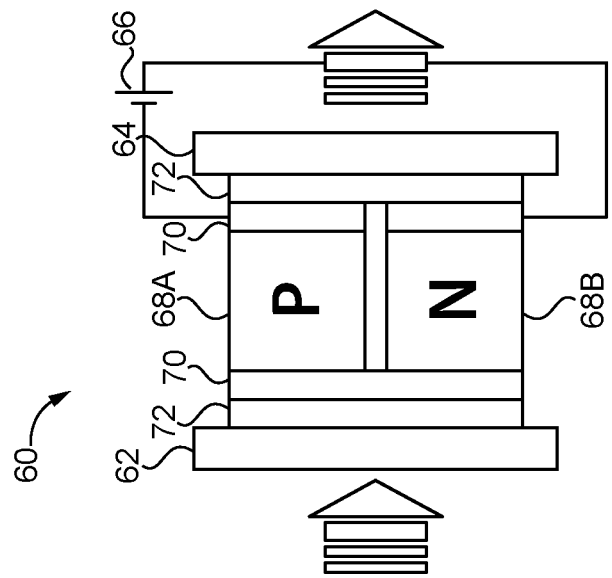
FIG. 3B is a cross-sectional schematic view of a portion of the thermoelectric cooler.
Figure 3A:
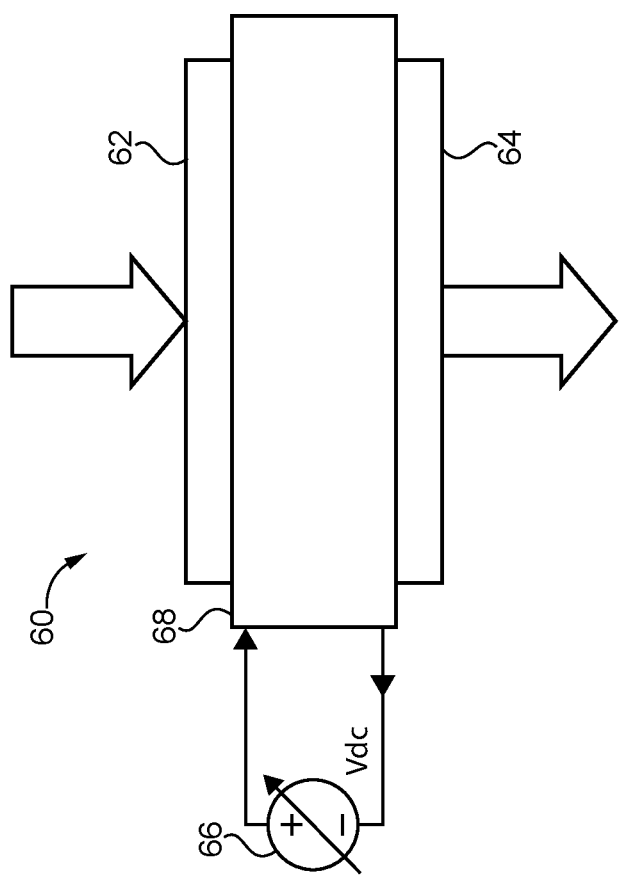
FIG. 3A is a schematic view of a thermoelectric cooler.

Turning to FIGS. 3A-3B, a thermoelectric cooler 60 may be used to cool the motor drive 22 in order to dissipate heat from the motor drive 22 and/or insulate the motor drive 22. Thermoelectric coolers 60 are generally known in the art, and thus, a detailed description is not necessary. As shown in FIG. 3A, a thermoelectric cooler 60 has a cold side 62 that absorbs heat and a hot side 64 that releases heat. Heat transfer is caused by applying a voltage 66 to semiconductors 68 between the cold and hot sides 62, 64. By varying the voltage 66 that is applied, the cold and hot sides 62, 64 can be varied in order to achieve a desired heat transfer from one side 62 to the other side 64. FIG. 3B shows a more detailed construction of a thermoelectric cooler 60. As shown, alternating P-type 68A and N-type 68B semiconductors are provided between the cold and hot sides 62, 64. Conductors 70 and insulators 72 are also provided on opposite sides of the semiconductors 68 between the semiconductors 68 and the respective cold and hot plates 62, 64.

As shown in FIG. 1, the thermoelectric cooler 60 may form one or more walls of the housing 28 enclosing the motor drive 22. In one particularly useful embodiment, the thermal electric cooler 60 is located between the motor drive 22 and the motor 12 with the hot side 64 facing the motor 12 and the cold side 62 facing the motor drive 22. In this arrangement, the thermoelectric cooler 60 isolates the motor drive 22 from the motor 12 and transfers heat from the solid-state switches 30 to the motor 12 and/or insulates the solid-state switches 30 from the heat of the motor 12. That is, in most arrangements, the motor 12 will generate more heat than the solid-state switches 30. However, the solid-state switches 30 are more susceptible to heat, both generated from the switches 30 themselves and from the motor 12. Thus, by placing the cold side 62 of the thermoelectric cooler 60 toward the switches 30 and the hot side 64 toward the motor 12, heat generated by the switches 30 can be transferred to the motor 12 to reduce the temperature of the switches 30. Although the motor 12 will experience a slightly higher temperature in this mode, the motor 12 is less affected by the increased temperature, and the switches 30 gain improved performance due to the lower temperature. Alternatively, or in conjunction therewith, the thermoelectric cooler 60 can be operated in an insulating mode. That is, it is of particular concern that the heat generated by the motor 12 not cause an increase in the temperature of the switches 30 beyond the temperature rise that occurs from operating the switches 30 themselves. Thus, the thermoelectric cooler 60 can be used to deflect the heat of the motor 12 away from the motor drive 22 and the switches 30 therein.

Preferably, the hot side 64 of the thermoelectric cooler 60 transmits heat to the housing 20 of the motor 12. Thus, the hot side 64 may be in contact with the motor housing 20. It may also be desirable for the motor housing 20 to be made of metal in the area of contact and for the motor housing 20 to have cooling fins 74 in thermal communication therewith to transfer heat away from the motor drive 22, through the motor housing 20, and away from the motor 12 through the cooling fins 74.

Typically, the substrate 76 of the solid-state switches 30 is mounted to a base plate 78 made of metal or other thermally conductive material to transfer heat away from the switches 30. As shown, it may be desirable for the cold side 62 of the thermoelectric cooler 60 opposite from the motor housing 20 to be in contact with the base plate 78 or the substrate 76 of the switches 30. Thus, heat may be transferred directly across the thermoelectric cooler 60 from the switches 30 to the motor housing 20.

In addition to providing a thermoelectric cooler 60 between the motor drive 22 and the motor 12, the thermoelectric cooler 60 may also form other walls of the motor drive housing 28. In this case, it may be desirable for the hot side 64 of the thermoelectric cooler 60 to also be exposed to the exterior environment in addition to the motor housing 20. For example, it may be desirable for the thermoelectric cooler 60 to wrap around the motor drive 22 and contact two opposite sides of the switches 30. As shown, this may involve contacting the base plate 78 or substrate 76 of the switches 30. Although FIG. 1 shows the cold side 62 contacting a base plate 78 on one side and the substrate 76 on the other side, it is understood that both sides could have base plates 78 or both sides could be in direct contact with the substrate 76. It may also be desirable for a heat sink with heat dissipating fins to be mounted directly onto the hot side 64 of the thermoelectric cooler 60.

If desired, the thermal electric cooler 60 may surround the majority of the motor drive 22 to enclose the motor drive 22 therein and provide a greater degree of heat transfer/insulation. For example, the thermal electric cooler 60 may surround at least five sides of the motor drive 22, and in the most enclosed arrangement, may enclose all six sides of the motor drive 22. Although the motor drive housing 28 may have flat sides as illustrated, it is also possible for the sides to be rounded, and in such case, the thermal electric cooler 60 could still be considered to be enclosing at least five sides or all six sides of the motor drive 22 facing in different directions. It is understood that, where the thermoelectric cooler 60 does not surround all sides of the motor drive, it may be desirable for the drive housing 28 to include non-thermoelectric cooling portions so that the drive 28 is sufficiently enclosed to prevent operators from coming into contact with the internal parts of the motor drive 22. It is also understood that the thermoelectric cooler 60 could be made of separate coolers that are interconnected with each other or separately controlled with respect to each other.

It may also be desirable to provide openings 80, 82 through the thermoelectric cooler 60 to pass cables 42, 34 therethrough. For example, the portion of the thermoelectric cooler 60 between the motor drive 22 and the motor 12 could be provided with an opening 80 to pass the cables 42 between the motor drive 22 and the stator 18. The motor housing 20 may also have a corresponding opening 84. An opening 82 may also be provided through the thermoelectric cooler 6 to pass the cables 34 connecting the power supply 36 to the motor drive 22. It is understood that, while the openings 80, 82 preferably circumscribe the respective cables 42, 34, the openings 80, 82 may be round, square, etc.

Turning to FIG. 2, a controller 86 is preferably provided for regulating the voltage supplied to the thermoelectric cooler 60 to control the amount of heat transferred from the cold side 62 to the hot side 64. For example, the controller 86 may include a buck converter that uses switches to convert the high DC voltage of the DC bus 38 to a lower voltage used by the thermoelectric cooler 60. It may be desirable to locate the controller 86 for the thermal electric cooler 60 within the drive housing 28. In this arrangement, the cables 88 supplying the voltage from the controller 86 to the thermoelectric cooler 60 may be internal to the housing 28 so that the cables 88 are not exposed. Even more preferably, the controller 86 draws power from the DC bus 38 between the sets 32, 40 of switches 30 to power the controller 86 and supply the voltage to control the thermoelectric cooler 60. As shown, it is also preferable for the switch controller 44 to be located within the drive housing 28. It is understood that, while the controllers 44, 86 are shown as two separate controllers 44, 86, it is possible for the two controllers 44, 86 to be incorporated into a single control unit.

While preferred embodiments of the inventions have been described, it should be understood that the inventions are not so limited, and modifications may be made without departing from the inventions herein. While each embodiment described herein may refer only to certain features and may not specifically refer to every feature described with respect to other embodiments, it should be recognized that the features described herein are interchangeable unless described otherwise, even where no reference is made to a specific feature. It should also be understood that the advantages described above are not necessarily the only advantages of the inventions, and it is not necessarily expected that all of the described advantages will be achieved with every embodiment of the inventions. The scope of the inventions is defined by the appended claims, and all devices and methods that come within the meaning of the claims, either literally or by equivalence, are intended to be embraced therein.

The invention claimed is:

1. A co-packaged electric motor and motor drive, comprising:
   the electric motor comprising a stator, a rotor and a first housing enclosing the stator and the rotor;
   the motor drive comprising a plurality of solid state switches converting electrical input power to electrical output power;
   a first conductor supplying the electrical input power to the motor drive;
   a second conductor connecting the electrical output power to the stator; and
   a thermoelectric cooler disposed between the motor drive and the electric motor, a hot side of the thermoelectric cooler being in thermal communication with the housing of the electric motor, and a cold side of the thermoelectric cooler being in thermal communication with the plurality of solid state switches.

2. The co-packaged electric motor and motor drive according to claim 1, wherein the plurality of solid state switches comprises gallium nitride or silicon carbide switches.

3. The co-packaged electric motor and motor drive according to claim 1, further comprising a second housing enclosing the motor drive, the first and second housings being attached together.

4. The co-packaged electric motor and motor drive according to claim 3, wherein the motor drive comprises a first controller enclosed within the second housing to open and close the plurality of solid state switches to convert the electrical input power to the electrical output power.

5. The co-packaged electric motor and motor drive according to claim 4, wherein the motor drive comprises a second controller enclosed within the second housing to regulate a voltage supplied to power the thermoelectric cooler.

6. The co-packaged electric motor and motor drive according to claim 5, wherein the electrical input power comprises AC power, the plurality of solid state switches comprising a rectifier converting the AC power to DC power, the second controller delivering a portion of the DC power to the thermoelectric cooler to regulate the voltage supplied to power the thermoelectric cooler.

7. The co-packaged electric motor and motor drive according to claim 3, wherein the thermoelectric cooler defines two or more walls of the second housing, the hot side of the thermoelectric cooler thereby being at least partially exposed to an exterior environment.

8. The co-packaged electric motor and motor drive according to claim 7, wherein the thermoelectric cooler defines at least five sides of the second housing facing in different directions.

9. The co-packaged electric motor and motor drive according to claim 7, wherein the thermoelectric cooler defines at least six sides of the second housing facing in different directions.

10. The co-packaged electric motor and motor drive according to claim 3, wherein the second housing comprises a first opening through which the first conductor passes.

11. The co-packaged electric motor and motor drive according to claim 10, wherein the first opening extends through the thermoelectric cooler, the first opening thereby circumscribing the first conductor.

12. The co-packaged electric motor and motor drive according to claim 1, wherein the thermoelectric cooler comprises a second opening through which the second conductor passes, the second opening thereby circumscribing the second conductor.

13. The co-packaged electric motor and motor drive according to claim 1, wherein the hot side of the thermoelectric cooler contacts the housing of the electric motor.

14. The co-packaged electric motor and motor drive according to claim 13, wherein the first housing is made of a thermally conductive material.

15. The co-packaged electric motor and motor drive according to claim 13, wherein the first housing comprises cooling fins.

16. The co-packaged electric motor and motor drive according to claim 1, wherein the cold side of the thermoelectric cooler contacts a base plate or substrate of the plurality of solid state switches.

17. The co-packaged electric motor and motor drive according to claim 16, wherein the cold side of the thermoelectric cooler contacts two opposing sides of the plurality of solid state switches.

18. The co-packaged electric motor and motor drive according to claim 1, further comprising a second housing enclosing the motor drive, the first and second housings being attached together, the hot side of the thermoelectric cooler contacts the housing of the electric motor, and the cold side of the thermoelectric cooler contacts a base plate or substrate of the plurality of solid state switches.

19. The co-packaged electric motor and motor drive according to claim 18, wherein the second housing comprises a first opening through which the first conductor passes, the motor drive comprises a first controller enclosed within the second housing to open and close the plurality of solid state switches to convert the electrical input power to the electrical output power, and the motor drive comprises a second controller enclosed within the second housing to regulate a voltage supplied to power the thermoelectric cooler.

20. The co-packaged electric motor and motor drive according to claim 19, wherein the thermoelectric cooler defines two or more walls of the second housing, the hot side of the thermoelectric cooler thereby being at least partially exposed to an exterior environment, the cold side of the thermoelectric cooler contacts two opposing sides of the plurality of solid state switches, the thermoelectric cooler comprises a second opening through which the second conductor passes, the second opening thereby circumscribing the second conductor, the first housing is made of a thermally conductive material, and the first housing comprises cooling fins.

* * * * *